United States Patent
Tomita

Patent Number: 6,025,645
Date of Patent: Feb. 15, 2000

[54] SEMICONDUCTOR DEVICE AND METHOD OF MANUFACTURING THE SAME

[75] Inventor: Kazuo Tomita, Tokyo, Japan

[73] Assignee: Mitsubishi Denki Kabushiki Kaisha, Tokyo, Japan

[21] Appl. No.: 09/102,570

[22] Filed: Jun. 23, 1998

[30] Foreign Application Priority Data

Dec. 19, 1997 [JP] Japan .................................. 9-351212

[51] Int. Cl.⁷ ........................... H01L 23/48; H01L 23/52; H01L 29/40
[52] U.S. Cl. .......................... 257/773; 257/750; 257/758
[58] Field of Search .................................... 257/773, 750, 257/758; 438/622, 623, 624, 625, 629

[56] References Cited

U.S. PATENT DOCUMENTS

| | | | |
|---|---|---|---|
| 5,399,527 | 3/1995 | Tabara | 438/622 |
| 5,629,236 | 5/1997 | Wada et al. | 438/622 |
| 5,864,179 | 1/1999 | Koyama | 257/767 |
| 5,874,779 | 2/1999 | Matsuno | 257/758 |

FOREIGN PATENT DOCUMENTS 8-250589  9/1996  Japan .
8-306664  11/1996  Japan .

*Primary Examiner*—Mahshid Saadat
*Assistant Examiner*—Jhihan B Clark
*Attorney, Agent, or Firm*—Oblon, Spivak, McClelland, Maier & Neustadt, P.C.

[57] ABSTRACT

After forming the first contact embedded in the first insulating film, a wire is formed on the first contact and a side wall made of an insulative substance is formed on a side surface of the wire. The second insulating film made of a substance different from the side wall is layered in a region including the wire, and a via hole for embedding the second contact is provided in the second insulating film under such an etching condition that the side wall is harder to etch, and therefore an end portion of the wire is not etched and an exposed area of an internal wall of the via hole can be reduced. It is possible to suppress deterioration gap-filling characteristics due to gas discharge from the second insulating film and achieve a contact of good shape. Thus, this structure avoids deterioration in imbedding characteristics that is caused by a deviation of alignment when the wire is interposed between a stacked via consisting of the first and second contacts.

12 Claims, 9 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having a stacked via, and more particularly to a semiconductor device including wires provided among a plurality of contacts constituting the stacked via, or a semiconductor device including wires placed near connections of a plurality of contacts.

2. Description of the Background Art

FIG. 12 is a cross section of a semiconductor device with stacked-via structure in the background art.

The semiconductor device of FIG. 12 has a semiconductor substrate 101, the first insulating film 102 layered on the semiconductor substrate 101, a barrier metal 103 layered on a surface of a contact hole provided in the first insulating film 102 and tungsten 104 filling the contact hole, and the barrier metal 103 and the tungsten 104 constitute the first contact 105.

On the first contact 105 provided is the first wire 109 by patterning, which consists of an AlCu film 107 and barrier metals 106 and 108 formed on bottom and upper surfaces of the AlCu film 107. On a surface of the first wire 109 and a surface of the insulating film 102 layered are an insulating film 110a having a uniform thickness and insulating films 110b and 110c both having evened surfaces, which constitute the second insulating film 110. The insulating films 110a and 110c are made of (δ-TEOS (δ-tetraethil orthosilicate) and the insulating film 110b is made of SOG (spin on grass).

A barrier metal 111 is formed in a portion which corresponds at least to a surface of a via hole provided in the second insulating film 110 on the surface of the first wire 109, and the via hole is filled with, for example, tungsten 112. The barrier metal 111 and the tungsten 112 constitute a contact 113.

Further, the second wire 117 consisting of an AlCu film 115 and barrier metal layers 114 and 116 formed on bottom and upper surfaces of the AlCu film 115 is so formed on a surface of the second insulating film 110 as to come into contact with the contact 113.

As shown in FIG. 12, when the first contact 105, the first wire 109, the second contact 113 and the second wire 117 are in good alignment, good mutual connection is obtained and good gap-filling characteristics of contact is also obtained.

In a case of FIG. 13, however, where a via hole 118 used for embedding the second contact 113 merely overlaps the first wire 109 and part of the via hole 118 is formed out of the surface of the first wire 109, the insulating film 110b made of the SOG of an internal wall of the via hole 118 has a wider exposed area. Therefore, when a film of conductive substance 112a is formed at high temperature by CVD (chemical vapor deposition) to fill the inside of the via hole 118, there is degas 119 from the SOG of the insulating film 110b and the degas 119 is discharged out through the via hole 118. For this reason, the via hole 118 is not completely filled with the conductive substance 112a, creating a void 118a.

When the void 118a is created inside the second contact 113a in the via hole 118 as shown in FIG. 14, a contact resistance substantially increases and it is thereby impossible to obtain a good electrical connection even if the second wire 117 is formed on the second contact 113a.

FIG. 15 is a cross section of a prior-art semiconductor device shown in Japanese Patent Application Laid Open Gazette 8-250589.

The semiconductor device of FIG. 15 has conductive films 120, 121, 122 and 123 constituting a wire 124 and conductive films 125 and 126 constituting a side wall 127, specifically, a Ti film 120, a TiN film 121, an Al—Si film 122, a TiN film 123, a TiN film 125 and a W film 126.

An interlayer insulating film 128 is layered on the wire 124 and a contact 131 is embedded in the interlayer insulating film 128, being in contact with the wire 124. The contact 131 consists of a TiN film 129 formed on an internal wall of the contact hole and a W film 130 filling an opening. A wire 135 is formed over an upper surface of the interlayer insulating film 128, being electrically connected to the contact 131. The wire 135 is constituted of a Ti film 132, an Al—Si film 133 and a TiN film 134 which are layered in this order The semiconductor device of FIG. 15 allows a good electrical connection, even if there is a deviation of alignment between the lower-layer wire 124 and the contact 131 formed thereon, because of a wider margin of alignment obtained by providing the side walls 127 made of a conductive substance attached on side surfaces of the wire 124.

In order to make the side wall 127 of a conductive substance, however, the conductive substance is layered on surfaces which correspond to a surface of the wire 124 and a bottom surface of the interlayer insulating film 128 (on which the wire 124 is provided by patterning), and an overetching for partially removing the conductive substance is needed to leave the side wall 127 in a manufacturing process, so that a short-circuit between the wire 124 and other wires is avoided, necessarily causing a damage on the upper surface of the wire 124 due to etching.

The damage to the TiN film 123 in a surface layer of the wire 124 deteriorates film quality as an antireflection film in patterning of the wire 124, and that causes a problem of hindering formation of a good etching mask.

Further, when the conductive substance of the side wall 127 on the interlayer insulating film 128 can not completely removed by etching, there arises another problem of causing a short-circuit between the stacked via and other conductive films.

Furthermore, as for a stacked-via structure, according to a background art of FIG. 16, when the stacked via is made by overlapping the first and second contacts 105 and 113, and a wire 136 which should be electrically insulated therefrom is formed near the stacked via, if there is only a small margin of alignment of the wire 136 and the first and second contacts 105 and 113, there arises still another problem of causing a short-circuit if a deviation of alignment exists.

SUMMARY OF THE INVENTION

The present invention is directed to a semiconductor device. According to a first aspect of the present invention, the semiconductor device comprises: a semiconductor substrate; a first insulating film layered on the semiconductor substrate; a second insulating film layered on a surface of the first insulating film; a first contact so formed on an active region in a surface region of the semiconductor substrate as to penetrate the first insulating film; a wire formed on the surface of the first insulating film, being in contact with the first contact; a side wall formed on a side surface of the wire, being made of an insulative substance different from a substance of the second insulating film; and a second contact embedded in the second insulating film.

According to a second aspect of the present invention, in the semiconductor device of the first aspect, the insulative substance of which the side wall is made is layered also on a region in the surface of the wire other than a contact face on which the wire comes into contact with the second contact and the surface of the first insulating film.

According to a third aspect of the present invention, in the semiconductor device of the second aspect, the wire includes a barrier metal layer in its upper surface or in its upper and bottom surfaces.

According to a fourth aspect of the present invention, in the semiconductor device of the first aspect, the second insulating film consists of a plurality of insulating layers including a flow layer provided from a bottom surface of the second insulating film to a level which corresponds to an upper surface of the wire.

According to a fifth aspect of the present invention, the semiconductor device comprises: a semiconductor substrate; a first insulating film layered on the semiconductor substrate; a second insulating film formed on a surface of the first insulating film; a first contact so formed on an active region in a surface region of the semiconductor substrate as to penetrate the first insulating film; a second contact so formed as to penetrate the second insulating film, being in contact with the first contact; a wire formed on the first insulating film; an insulating film layered on the wire, being made of an insulative substance different from a substance of the second insulating film; and a side wall formed on side surfaces of the wire and the insulating film, being made of an insulative substance different from the substance of the second insulating film.

According to a sixth aspect of the present invention, in the semiconductor device of the fifth aspect, the wire is disposed on the first insulating film with another insulating film interposed therebetween.

According to a seventh aspect of the present invention, in the semiconductor device of the fifth aspect, the second contact or both the first and second contacts overlap at least part of the wire.

According to an eighth aspect of the present invention, in the semiconductor device of the first aspect, an upper-layer wire or a capacitor is so formed on the second insulating film as to be in contact with the second contact.

The present invention is also directed to a method of manufacturing a semiconductor device. According to a ninth aspect of the present invention, the method comprises the steps of: layering a first insulating film on a semiconductor substrate; forming a first contact on an active region in a surface region of the semiconductor substrate in such a manner that the first contact penetrates the first insulating film; providing a wire by patterning on the first insulating film in such a manner that the wire comes into contact with the first contact; forming a side wall made of an insulative substance at least on a side surface of the wire by layering the insulative substance on the first insulating film including a surface of the wire and etching back the insulative substance; layering a second insulating film on the wire, the first insulating film and the insulative substance, being made of a substance different from the insulative substance; and embedding a second contact in the second insulating film, to be brought into contact with the wire.

According to a tenth aspect of the present invention, in the method of the ninth aspect, the insulative substance on the first insulating film other than the wire and a region for forming the side wall is completely removed by etching in the step of forming the side wall.

According to an eleventh aspect of the present invention, the method of manufacturing a semiconductor device comprises the steps of: layering a first insulating film on a semiconductor substrate; forming a first contact on an active region in a surface region of the semiconductor substrate in such a manner that the first contact penetrates the first insulating film; providing a wire by layering a conductive film and an insulative film on the first insulating film and patterning the conductive film and the insulating film in a predetermined configuration; forming a side wall made of an insulative substance at least on a side surface of the wire by layering the insulative substance on the wire and the first insulating film and etching back the insulative substance; layering a second insulating film on the wire, the first insulating film and the side wall, being made of a substance different from the insulative substance; and forming a second contact to be brought into contact with the first contact in such a manner that the second contact penetrates the second insulating film.

According to a twelfth aspect of the present invention, in the method of the tenth aspect, another insulating film is disposed on the first insulating film and the wire is disposed on the another insulating film.

In the semiconductor device of the first aspect of the present invention, since the side wall is formed on the side surface of the wire by layering the insulative substance which is different from the second insulating film, even if part of the via hole overlaps the side wall due to a deviation of alignment when the via hole is provided in the second insulating film to embed the second contact, the side wall serves as an etching stopper to suppress an unnecessary etching of the second insulating film. Therefore, it is possible to reduce an exposed area of the second insulating film in the via hole and suppress deterioration in gap-filling characteristics of the contact due to the degas.

In the semiconductor device of the second aspect, since the etching of the insulative substance is stopped in a state where the insulative substance is lightly left on the upper surface of the wire and the surface of the first insulating film when the side wall is formed, overetching of the surface of the wire can be controlled and it therefore becomes possible to suppress deterioration in film quality of the surface of the wire as an antireflection film. Since the substance of the side wall is not conductive but insulative, no short-circuit occurs between the wire and other wires even if the film of this substance is lightly left on the first insulating film.

In the semiconductor device of the third aspect, since the wire includes the barrier metal layer in its upper surface or in both its upper and bottom surfaces, a good connection can be achieved between the wire and the first and second contacts, and further a good photolithography can be performed since the barrier metal layer in the upper surface of the wire serves as an antireflection film.

In the semiconductor device of the fourth aspect, since the side wall is formed by layering the substance different from the second insulating film on the side surface of the wire also when the second insulating film includes the flow layer at the level of the wire, it is possible to suppress exposure of the flow layer when the via hole is provided and control the degas from the flow layer when the temperature rises. Therefore, the contact of good gap-filling characteristics can be achieved.

In the semiconductor device of the fifth aspect, since the surface of the wire is surrounded by the insulating film made of the substance different from the second insulating film and the side wall when the wire and the second contact which are electrically insulated from each other are formed without margin of alignment, a short-circuit between the wire and the second contact can be suppressed. Thus, since it is possible to suppress a short-circuit and avoid an electrical ill effect even if there is no margin of alignment, a highly-integrated structure can be achieved.

In the semiconductor device of the sixth aspect, since another insulating film is formed on the bottom surface of the wire, the first contact and the wire can be surely insulated from each other even if partly overlap due to the deviation of alignment.

In the semiconductor device of the seventh aspect, since the insulating film and the side wall are formed on the upper, side and bottom surfaces of the wire, it is possible to suppress a short-circuit between the second contact and the wire or between the first and second contacts and the wire even if partly overlap due to no margin of alignment for high integration.

In the semiconductor device of the eighth aspect, since the upper-layer wire or the capacitor is formed, being in contact with the second contact, it is possible to transfer a potential of the upper-layer wire or the capacitor in good condition to the first and second contacts, and also to the wire if the structure is applied to the semiconductor device of the first aspect.

The method of a semiconductor device of the ninth aspect allows the second contact to be embedded in good condition with no void when the wire is interposed in the stacked via consisting of the first and second contacts.

The method of the tenth aspect suppress deterioration in film quality as an antireflection film since the shallow etchback in forming the side wall lightly leaves the insulative substance on the surfaces of the wire and the first insulating film and avoids a damage of the surface of the wire due to overetching. Further, since the film that is lightly left on the first insulating film is not conductive but insulative, there is no possibility of causing a short-circuit between the wire and other wires.

The method of the eleventh aspect suppresses a short-circuit between the wire and the contacts by covering the surface of the wire with the substance different from the second insulating film when the wire is formed in the vicinity of the stacked via consisting of the first and second contacts, being electrically insulated therefrom. Since the electrical insulation is ensured even when the wire and the contact partly overlap each other, a semiconductor device of good electrical characteristics can be achieved when the structure is applied to a device with no margin of alignment.

The method of the twelfth aspect surely suppresses a short-circuit between the first contact and the wire even if there is a deviation of alignment therebetween since the insulating film is formed also on the bottom surface of the wire.

An object of the present invention is to provide a semiconductor device with stacked-via structure, having a wire provided between two contacts constituting a stacked via, which achieves excellent electric characteristics with no void created in filling a via hole.

Another object of the present invention is to provide a semiconductor device with stacked-via structure which achieves excellent electric characteristics with a higher electrical insulation between the stacked via and a wire in the vicinity thereof on an interlayer insulating film.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Now, the first preferred embodiment of the present invention will be discussed.

Figure 1:
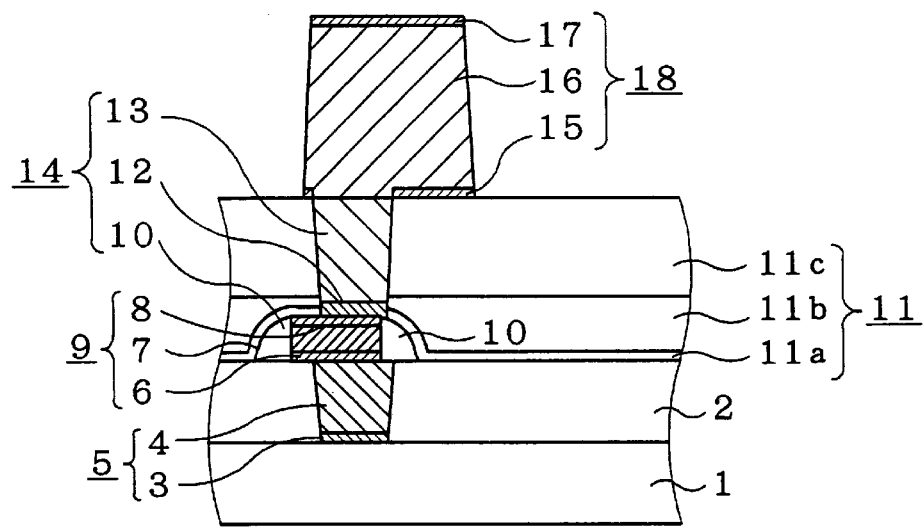
FIG. 1 shows a semiconductor device in accordance with a first preferred embodiment of the present invention.

FIG. 1 is a cross section of a semiconductor device of the first preferred embodiment. The semiconductor device of FIG. 1 has a semiconductor substrate 1, for example, a P-type silicon substrate which is a wafer having resistivity of 10 Ω·cm, the first insulating film 2 layered on the semiconductor substrate 1, a barrier metal 3 layered on a surface in a contact hole provided in the first insulating film 2, being in contact with an active region in a surface region of the semiconductor substrate 1 and tungsten 4 layered on the barrier metal 3 to fill the contact hole, and the barrier metal 3 and the tungsten 4 constitute the first contact 5.

A wire 9 is provided on the contact 5 with a deviation of alignment, and consists of a barrier metal 6, an AlCu film 7 and an upper-layer barrier metal 8. Side walls 10 made of an insulative substance are formed on side surfaces of the wire 9.

On a surface of the wire 9 layered are the first, second and third interlayer insulating films 11a, 11b and 11c constituting the second insulating film 11. The second interlayer insulating film 11b is made of, e.g., SOG.

A via hole penetrating the second insulating film 11 and reaching the wire 9 is filled with a barrier metal 12 and tungsten 13 which constitute the second contact 14.

When the via hole and the wire 9 are formed with a deviation of alignment, part of the second contact 14 partly overlaps the side wall 10.

On the second insulating film 11 formed is an upper-layer wire 18 consisting of a barrier metal 15, an AlCu film 16 and an upper-layer barrier metal 17, being in contact with an upper layer of the second contact 14.

Next, a method for manufacturing the semiconductor device of FIG. 1 will be discussed.

Figure 2A:
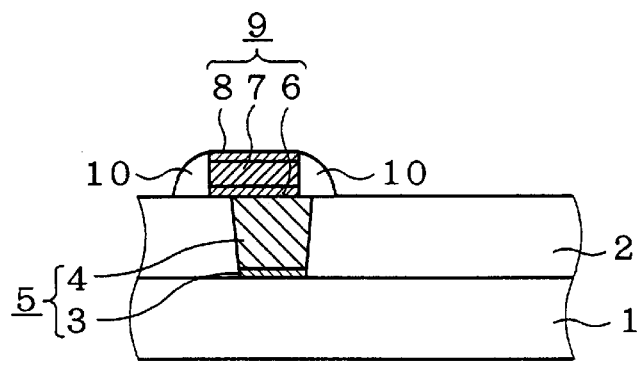
FIGS. 2A and 2B show a flow of manufacturing the semiconductor device in accordance with the first preferred embodiment of the present invention.

First, as shown in FIG. 2A, the first insulating film 2 made of a silicon oxide film is layered to have a film thickness of about 6000 Å on the semiconductor substrate 1 having an impurity region in its surface region. Second, a contact hole is provided in the second insulating film 2, to expose the impurity region in the surface region of the semiconductor substrate 1. Subsequently, the barrier metal 3 consisting of a Ti film having a thickness of about 300 Å and a TiN film having a thickness of about 500 Å is formed on a surface of the contact hole and the tungsten 4 is layered thereon to have a thickness of about 5000 Å, filling the contact hole, to thus obtain the first contact 5. The tungsten layered on a surface of the first insulating film 2 is removed by CMP (chemical mechanical polishing) or dry etching such as RIE (reactive ion etching).

Though the contact hole is filled with the tungsten in this example, it may be filled with doped polysilicon, titanium nitride, aluminum or the like. Further, for removing the conductive film layered on the surface of the first insulting film 2, a dry etchback or the like, other than the CMP, may be used.

On the first contact 5 layered are the barrier metal 6 consisting of a Ti film having a thickness of about 300 Å and a TiN film having a thickness of about 150 Å, the AlCu film 7 having a thickness of about 5000 Å and the upper-layer barrier metal 8 consisting of a Ti film having a thickness of about 50 Å and a TiN film having a thickness of about 150 Å in this order and the layered films are patterned with a mask corresponding to the configuration of the wire 9, to thus obtain the wire 9. Further, after forming an insulative substance such as a silicon nitride film to have a thickness of about 1500 Å, an etchback is performed by RIE, to form side walls 10 like frames on side surfaces of the wire 9.

When a wiring width of the wire 9 and a diameter of the first contact 5 are almost equal in their formation, there is some case where the wire 9 and the first contact 5 partly overlap each other due to a deviation of alignment if an etching mask is made by photolithography in a step of forming the wire 9.

Figure 2B:
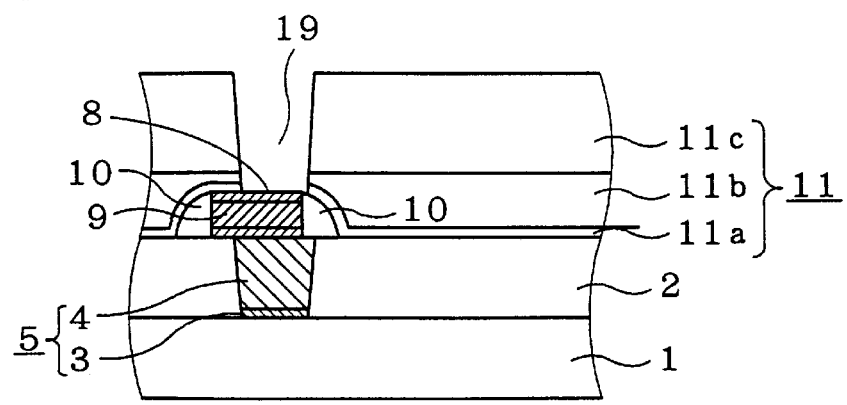

Subsequently, as shown in FIG. 2B, the first interlayer insulating film 11a made of δ-TEOS and having a thickness of about 2000 Å, the second interlayer insulating film 11b made of SOG and having a thickness of about 2000 Å and the third interlayer insulating film 11c made of δ-TEOS and having a thickness of about 6000 Å are layered in this order on surfaces of the wire 9 and the side walls 10 and the surface of the second insulating film 2, and the layered films are annealed to be cured and thus obtain the second insulating film 11. Furthermore, a treatment is required to even the surface of the second insulating film 11.

After that, an etching mask having an open pattern corresponding to the second contact 14 is formed on the second insulating film 11, and with this etching mask, the second insulating film 11 is opened, keeping a selection ratio of the second insulating film 11 to the upper-layer barrier metal 8, by, for example, an ECR device using a mixed gas of $C_4F_8$ and $O_2$, to provide the via hole 19.

Even if the open pattern of the etching mask corresponding to the second contact 14 is formed by photolithography with a deviation of alignment between the second contact 14 and the wire 9, only part of the side wall 10 formed on the side surface of the wire 9 is exposed but the second interlayer insulating film 11b made of SOG which discharges a gas when heated is not more exposed than required in the via hole 19.

Like the formation of the first contact 5, a Ti film having a thickness of about 300 Å and a TiN film having a thickness of about 500 Å are layered to form the barrier metal 12 in the via hole 19 and further the tungsten 13 is provided thereon to fill the via hole 19, and an unnecessary conductive film layered on a surface of the second insulating film 11 is removed by CMP or dry etchback such as RIE, leaving only a necessary conductive film, to thus obtain the second contact 14. At this time, in the vicinity of the via hole 19 on the second insulating film 11 left is a layered structure of the Ti and TiN films which is formed at the same time as the barrier metal 12 is formed.

Subsequently, the AlCu film 16 having a thickness of about 5000 Å and the upper-layer barrier metal 17 consisting of a Ti film having a thickness of about 300 Å and a TiN film having a thickness of about 500 Å are layered in this order on the barrier metal 15 of the layered structure consisting of the Ti and TiN films left on the surface of the second insulating film 11, and further an etching mask corresponding to a configuration of the upper-layer wire 18 is formed and with this mask, the layered films are patterned to form the upper-layer wire 18, being in contact with the second contact 14.

The semiconductor device with stacked-via structure reduces an exposed area of the second interlayer insulting film 11b in providing the via hole 19 even if the second contact 14 and the wire 9 are not aligned because the side walls 10 is made of an insulative substance which is harder to etch than the second insulating film 11, and suppresses the discharge of gas by controlling the temperature condition in filling the via hole 19, allowing improvement in gap-filling characteristics. As a result, it is possible to achieve the second contact 14 of excellent form with no void.

Figure 3:
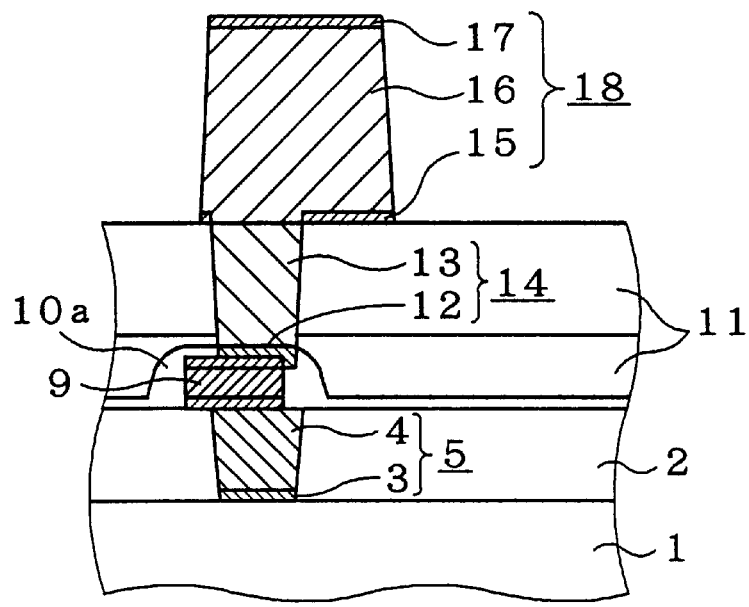
FIG. 3 shows the semiconductor device in accordance with the first preferred embodiment of the present invention.

Further, as shown in FIG. 3, by performing an etching shallower than that in the manufacturing step of FIG. 2A when insulating films 10a are formed like frames on the side surfaces of the wire 9, an insulative substance may be left not only on the side surface of the wire 9 but also lightly on the wire 9 and the first insulating film 2.

Even when the insulating films 10a are formed as above, there is no possibility of short-circuit between the wire 9 and other wires since the substance layered on the surface of the first insulating film 2 is not conductive and there is also no possibility of deteriorating the film quality of the upper surface of the wire 9 as an antireflection film since the surface of the wire 9 is not unnecessarily overetched. Therefore, it is possible to provide a semiconductor device of good electric characteristics.

Further, forming the side walls 10 on the side surfaces of the wire 9 improves the evenness of its surface and also improves coverage in formation of the second insulating film 11 layered thereon.

Though the upper-layer wire 18 is formed on the second contact 14 included in the stacked-via structure in the above-discussed example, other element such as a capacitor may be disposed on the second contact 14, and for each constituent of the above device, other element having like property may be used. Furthermore, it is natural that in accordance with the size of an element to be obtained, sizes of other elements can vary.

Though, for example, the second insulating film 11 is a flow layer consisting of δ-TEOS, SOG and δ-TEOS in the above discussion, a flow layer of triple-layered structure consisting of a cap layer, a flow layer and a base layer which are different interlayer insulating films may be formed by APL (advanced planarized layer), to achieve the same effect.

Further, though the second contact 14 is filled with the tungsten 13, it may be filled with other conductive film such as doped polysilicon, titanium nitride and aluminum.

The Second Preferred Embodiment

The second preferred embodiment of the present invention will be discussed.

While a wire is provided between the two contacts constituting a stacked via in the first preferred embodiment, the wire is provided in the vicinity of the stacked via in the second preferred embodiment and a technique to ensure an electrical insulation between the stacked via and the wire in this arrangement will be discussed.

Figure 4:
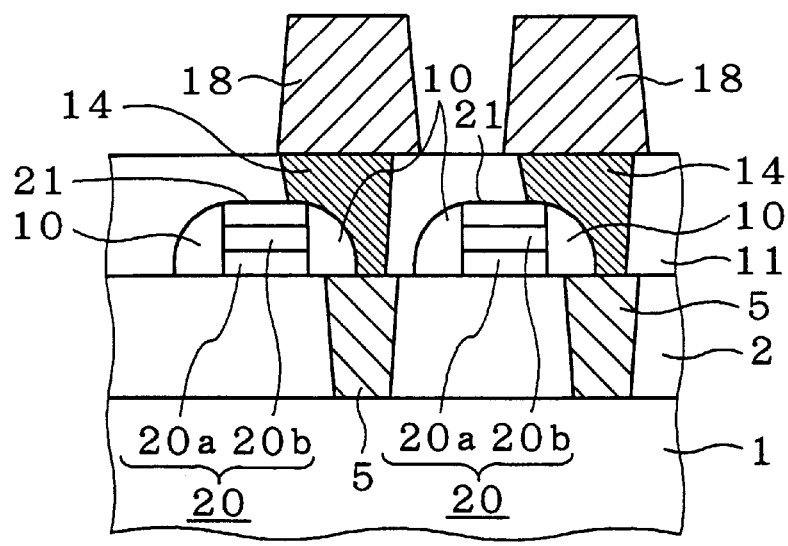
FIG. 4 shows a semiconductor device in accordance with a second preferred embodiment of the present invention.

FIG. 4 shows a semiconductor device of the second preferred embodiment. The semiconductor device of FIG. 4 has a wire 20 formed on the first insulating film 2, consisting of a doped polysilicon film 20a having a thickness of about 1000 Å and a WSi film 20b having a thickness of about 1000 Å, and an insulating film 21 made of a silicon nitride film having a thickness of about 2000 Å which is layered on the wire 20.

Further, the side walls 10 made of an insulative substance are formed like frames on side surfaces of the wire 20 and the insulating film 21.

Reference signs identical to those in the above discussion represent constituents identical or corresponding thereto.

The wire 20 is disposed in the vicinity of the first and second contacts 5 and 14. The first contact 5 and the wire 20 do not overlap each other and the second contact 14 partly overlaps the wire 20 with the insulating film 21 interposed therebetween. Interposing the insulating film 21 and the side walls 10 made of an insulative substance between the second contact 14 and the wire 20 suppresses a short-circuit therebetween.

Next, a method for manufacturing the semiconductor device of FIG. 4 will be discussed.

Figure 5A:
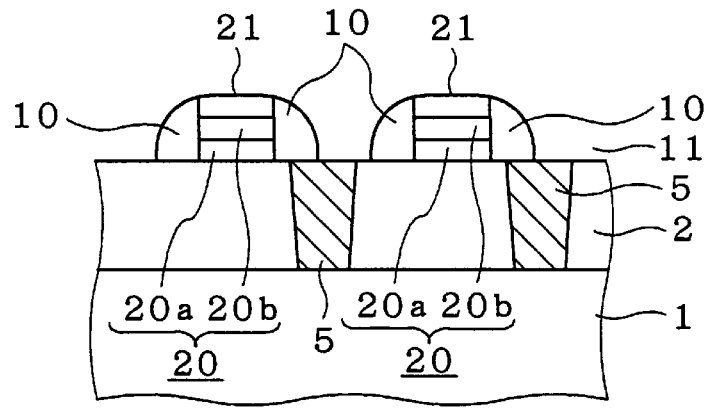
FIGS. 5A and 5B show a flow of manufacturing the semiconductor device in accordance with the second preferred embodiment of the present invention.

First, as shown in FIG. 5A, the first contact 5 is so formed as to penetrate the first insulating film 2 in accordance with the manufacturing method of the first preferred embodiment shown in FIG. 2A. Subsequently, the doped polysilicon film 20a and the WSi film 20b are formed on the first insulting film 2 to each have a thickness of about 1000 Å. Further, the insulating film 21 made of a silicon nitride film is layered thereon to have a thickness of about 2000 Å, and with a mask pattern corresponding to the configuration of the wire 20, the insulating film 21 is patterned. Using the patterned insulating film 21 as an etching mask, the WSi film 20b and the doped polysilicon film 20a are anisotropically etched in this order, to obtain the wire 20 constituted of the doped polysilicon film 20a and the WSi film 20b. The wire 20 is patterned to have a minimum size of 0.25 μm and so disposed as not to cause a short-circuit between the wire 20 and the first contact 5.

Further, a silicon nitride film is layered on a surface of the semiconductor device under manufacture by CVD to have a thickness of about 1500 Å, and the silicon nitride film is etched back by RIE, to form the side walls 10 made of the silicon nitride film on the side surfaces of the insulating film 21 and the wire 20 like frames.

Figure 5B:
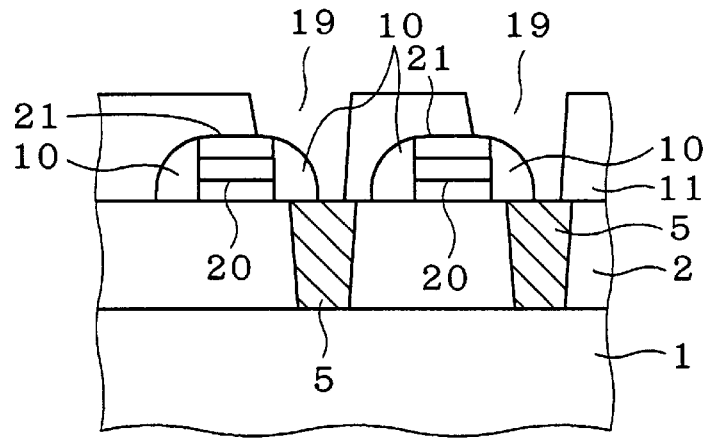

After that, as shown in FIG. 5B, the second insulating film 11 made of, e.g., a silicon oxide film is layered thereon to have a thickness of about 6000 Å and the second insulating film 11 is opened to provide the via hole 19 so that an upper surface of the first contact 5 may be exposed. The second insulating film 11 can be layered with good coverage since its surface is evened by forming the side walls 10 on the side surfaces of the wire 20 and insulating film 21.

In this step, the wire 20 is not exposed to the inside of the via hole 19 because the upper surface and side surfaces of the wire 20 is covered with the insulating film 21 and side walls 10 both of which are made of the silicon nitride film.

Subsequently, the via hole 19 is filled with a conductive substance to form the second contact 14, thus obtaining the stacked via consisting of the first and second contacts 5 and 14. Further, the upper-layer wire 18 is provided by patterning on the second contact 14, to obtain the semiconductor device of FIG. 4.

As discussed above, in the semiconductor device with a stacked via, when there is a possibility of causing a short-circuit because the second contact 14 included in the stacked via and the wire 20 partly overlap each other due to a deviation of alignment or of producing an electrical ill effect on each other because the second contact 14 and the wire 20 are arranged so close though they do not overlap each other, it is possible to suppress the short-circuit and the electrical ill effect by forming the side walls 10 on the side surfaces of the wire 20 and the insulating film 21.

Though the method for suppressing the short-circuit when the wire 20 and the second contact 14 partly overlap each other is discussed in the second preferred embodiment, it is naturally possible to achieve good electric characteristics without any short-circuit between the stacked via and the wire 20 if the first and second contacts 5 and 14 and the wire 20 are arranged with no deviation.

Further, though the side wall 10 formed on the side surfaces of the wire 20 and the insulating film 21 is made of a silicon nitride film in the above example, other insulative substances may be used only if it can ensure a sufficient selection ratio to the second insulating film 11 when the via hole 19 is provided.

Furthermore, though the silicon nitride film which is layered to form the side wall 10 have a thickness of about 1500 Å, the thickness can vary in a range of 50 to 3000 Å in accordance with a designed size of a device to which it is applied, and the thickness of the second insulating film 11 can vary in a range of 100 to 20000 Å to obtain the semiconductor device of good electric characteristics.

The Third Preferred Embodiment

The second preferred embodiment shows the semiconductor device having such a structure as to avoid a short-circuit between the stacked via and the wire even if there is a deviation of alignment when the wire is provided in the vicinity of the stacked via.

The third preferred embodiment is a variation of the second preferred embodiment, where a capacitor, for example, which is a constituent of a DRAM memory cell is formed on the second contact 14 included in the stacked via.

Figure 6:
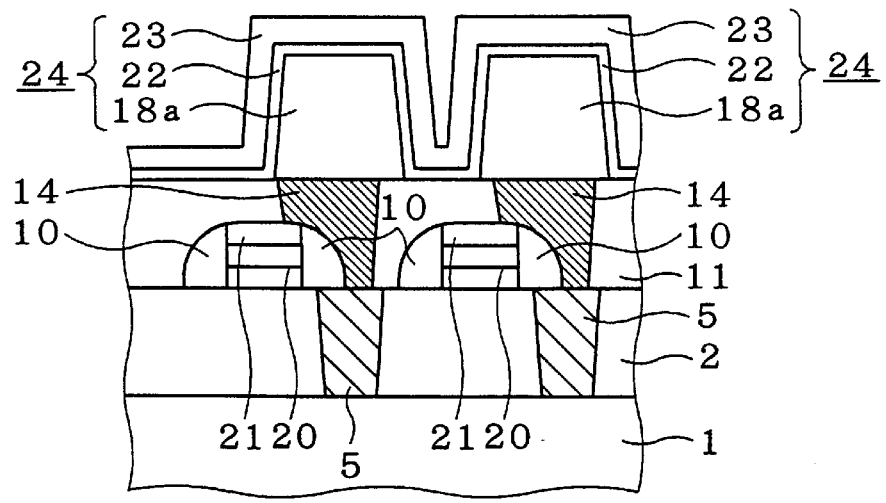
FIG. 6 shows a semiconductor device in accordance with a third preferred embodiment of the present invention.

A semiconductor device of FIG. 6 has a storage node 18a disposed on the second contact 14, a cell plate 23 layered on a surface of the storage node 18a with a dielectric film 22 interposed therebetween, and the storage node 18a, the dielectric film 22 and the cell plate 23 constitute a capacitor 24. Reference signs identical to those in the above discussions represent constituents identical or corresponding thereto.

To obtain the capacitor 24, for example, a doped polysilicon film having a thickness of about 6000 Å is patterned to form the storage node 18a, a composite film (ON film) of an oxide film and a nitride film, having a thickness of about 50 Å, which serves as the dielectric film 22 is layered at least on a surface of the storage node 18a and a doped polysilicon film having a thickness of 1500 Å which serves as the cell plate 23 is layered on the dielectric film 22.

Thus, if it is possible to surely suppress the short-circuit between the stacked via and the wire 20 provided in the vicinity thereof, it is particularly effective that the structure is applied to a memory cell region which is most rigorously required to achieve size reduction and high integration, and it becomes possible to increase the number of memory elements without expanding a region for forming elements.

The Fourth Preferred Embodiment

The fourth preferred embodiment of the present invention will be discussed.

In the second and third preferred embodiments discussed are a technique to suppress the short-circuit between the second contact 14 and the wire 20 even if there is a deviation of alignment therebetween and its effective application example.

In the fourth preferred embodiment, a technique to suppress a short-circuit between the first contact 5 and the wire 20 when the first contact 5 and the wire 20 overlap each other due to a deviation of alignment, as well as a short-circuit between the wire 20 and the second contact 14.

Figure 7:
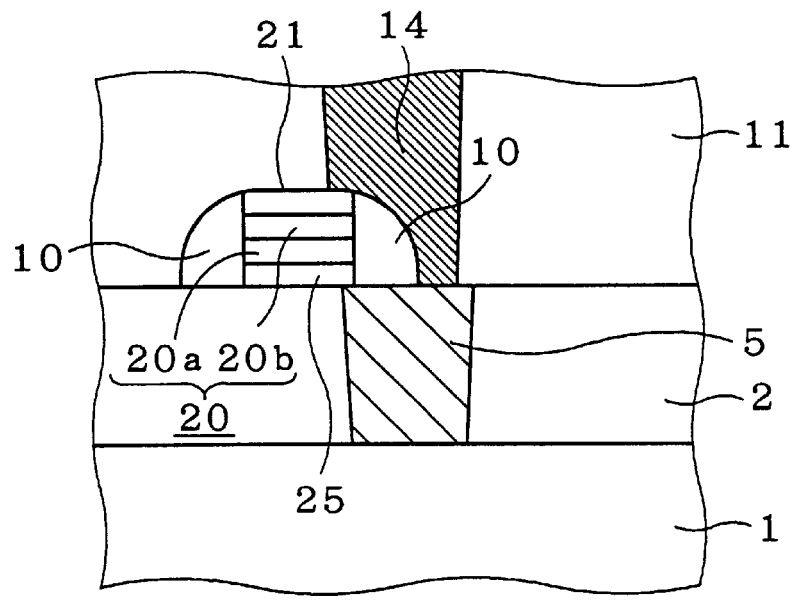
FIG. 7 shows a semiconductor device in accordance with a fourth preferred embodiment of the present invention.

FIG. 7 is a cross section of an essential part of a semiconductor device of the fourth preferred embodiment. The semiconductor device of FIG. 7 has an insulating film 25 disposed below the wire 20.

The insulating film 25 is made of an insulative substance such as a silicon nitride film or a silicon oxide film and have such a thickness as to obtain almost as high insulation as the insulating film 21 layered on the wire 20.

The wire 20 can be circumferentially covered with insulative substances by disposing the insulating film 25 on a bottom surface of the wire 20 as above. Therefore, no short-circuit occurs even when the first contact 5 and the wire 20 partly overlap each other due to a deviation of alignment because the insulating film 25 is interposed therebetween, and as a result the semiconductor device of good electric characteristics can be obtained. It is naturally possible to ensure an electrical insulation between the stacked via consisting of the first and second contacts 5 and 14 and the wire 20 when no deviation of alignment between the wire 20 and the first contact 5 and between the wire 20 and the second contact 14.

It is necessary that the insulating film 21 and the side walls 10 formed on the upper surface and side surfaces of the wire 20 should be harder to etch than the second insulating film 11 under the condition of providing the via hole 19, and the insulating film 25 below the wire 20 may be made of other insulative substance since the insulating film 25 is not exposed when the via hole 19 is provided.

The Fifth Preferred Embodiment

The fifth preferred embodiment of the present invention will be discussed.

In the fourth preferred embodiment shown is an example of achieving an electrical insulation between the contact 5 and the wire 20 which are closely disposed by forming the insulating film 25 on the bottom surface of the wire 20 in such a manner that its plan view is identical to that of the wire 20 even when the contact 5 and the wire 20 partly overlap each other.

In the fifth preferred embodiment, an insulating film to be disposed on the bottom surface of the wire 20 is patterned in such a manner that its plan view corresponds to bottom surfaces of the side walls 10 formed like frames on the side surfaces of wire 20 and the bottom surface of the wire 20.

Figure 8:
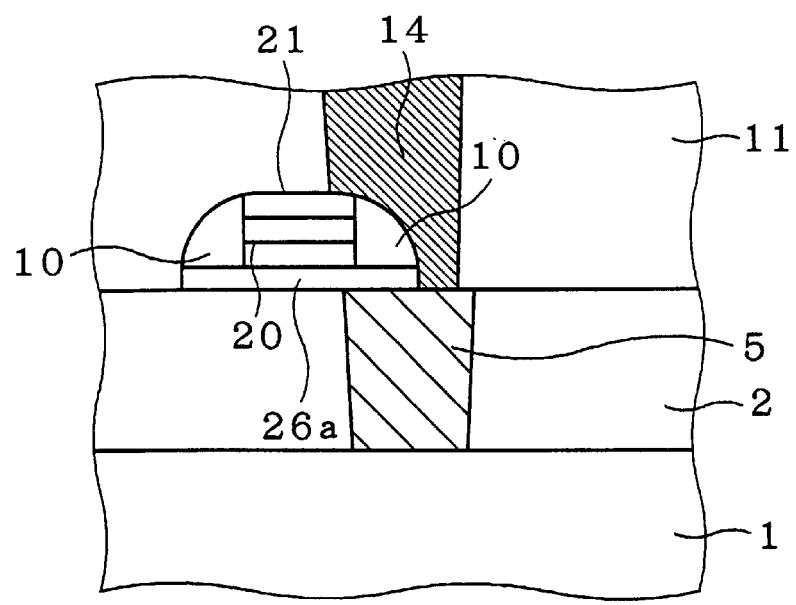
FIG. 8 shows a semiconductor device in accordance with a fifth preferred embodiment of the present invention.

FIG. 8 is a cross section of a semiconductor device of the fifth preferred embodiment. The semiconductor device of FIG. 8 has an insulating film 26a formed on the bottom surfaces of the wire 20 and the side walls 10. Reference signs identical to those in the above discussions represent constituents identical or corresponding thereto. In FIG. 8, the first contact 5 and the second contact 14 thereabove constitute the stacked via and the wire 20 is disposed in the vicinity of the stacked via, to be electrically insulated therefrom, and the wire 20 partly overlaps the first contact 5 and the second contact 14 due to a deviation of alignment.

Figure 9A:
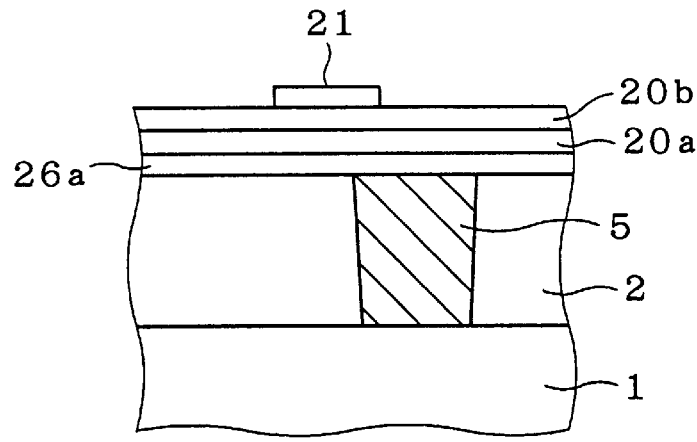
FIGS. 9A to 9C and 10A to 10C show a flow of manufacturing the semiconductor device in accordance with the fifth preferred embodiment of the present invention.
Figure 9B:
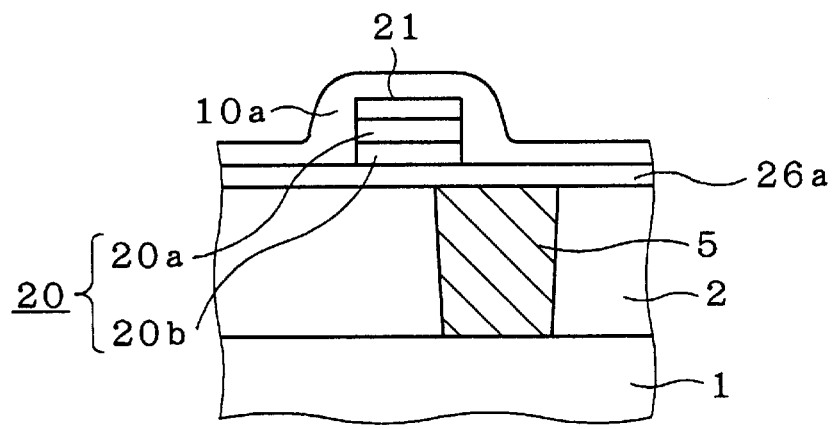
Figure 9C:
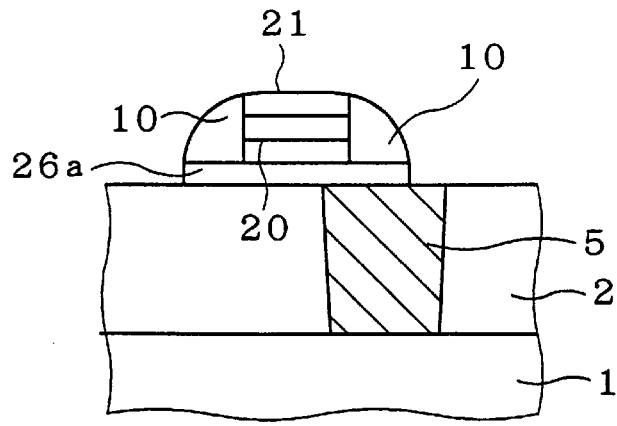

With reference to FIGS. 9A to 9C, a method for manufacturing the semiconductor device of FIG. 8 will be discussed.

First, as shown in FIG. 9A, after forming an active region in the surface region of the semiconductor substrate 1, a TEOS is layered to have a thickness of 3000 Å or less, thus obtaining the first insulating film 2. Further, a contact hole penetrating the first insulating film 2 and coming into contact with the active region is provided to embed the first contact 5 and a doped polysilicon is layered to have a film thickness of about 2000 Å, filling the contact hole, to obtain the first contact 5. The doped polysilicon layered on the surface of the first insulating film 2 is removed by etchback using RIE method, to leave only the first contact 5.

Further, a TEOS, for example, is layered to have a thickness of 1000 Å or less, thus obtaining the insulating film 26a. The film thickness of the insulating film 26a is so controlled as to ensure an electrical insulation between the wire 20 and the first contact 5 disposed vertically with the insulating film 26a interposed therebetween when the wire 20 and the first contact 5 overlap each other.

Subsequently, the doped polysilicon film 20a which is a constituent of the wire 20 is layered to have a thickness of about 800 Å and further the WSi film 20b is layered by CVD to have a thickness of about 800 Å. The insulating film 21 made of TiN which is used as the etching mask in patterning of the wire 20 is layered to have a thickness of 1000 Å and the insulating film 21 is patterned into a configuration corresponding to the wire 20.

After that, as shown in FIG. 9B, using the insulating film 21 as the etching mask and the insulating film 26a as the etching stopper, the WSi film 20b and the doped polysilicon film 20a are patterned in this order, to obtain the wire 20. Further, the insulating film 10a such as a SiN, to serve as the side wall 10 is layered to have a thickness of about 700 Å.

Subsequently, as shown in FIG. 9C, the insulating film 10a and the insulating film 26a made of the TEOS are etched back, to obtain the side wall 10 made of the insulating film 10a and further obtain the insulating film 26a having a plan view which corresponds to those of the wire 20 and the side walls 10. Even if the wire 20 and the first contact 5 partly overlap each other, it is possible to electrically insulate the wire 20 and the first contact 5 from each other since the insulating film 26a is interposed therebetween.

After that, the second insulating film 11 is layered like in the fourth preferred embodiment and the second contact 14 is formed, thus obtaining the semiconductor device of FIG. 8.

Furthermore, even if the second contact 14 and the wire 20 overlap each other, the wire 20 is not exposed since its upper surface is covered with the insulating film 21 and its side surfaces are covered with the insulative side walls 10 and the insulating film 21 and the side wall 10 are made of substances that are harder to etch than the second insulating film 11 when the via hole 19 is provided, and therefore it is possible to ensure an electrical insulation between the wire 20 and the second contact 14 when the second contact 14 is formed.

Figure 10A:
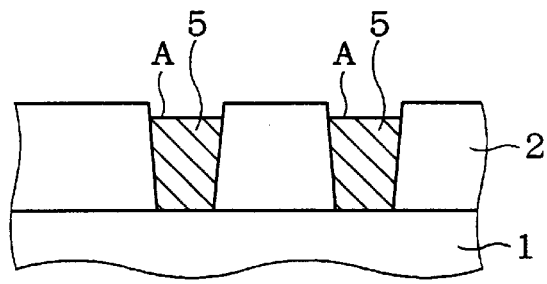

In the semiconductor device of FIG. 8, when the first contact 5 is formed, the upper surfaces of the first insulating film 2 and the first contact 5 are even. There is a case, however, where after filling the contact hole with a conductive substance to form the first contact 5, the upper surface of the first contact 5 is overetched to create a level difference between the upper surfaces of the first contact 5 and the first insulating film 2, as shown in FIG. 10A, when the conductive substance over the surface of the first insulating film 2 is etched back by RIE. The reference sign A of FIG. 10A indicates an overetched portion.

Figure 10B:
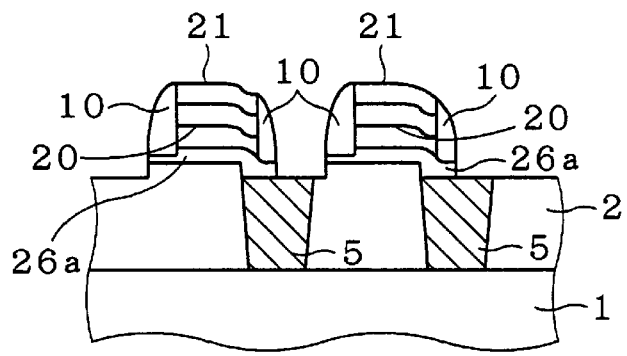

The level difference in the overetched portion A has an effect on the later formation of the wire 20, and if there is a deviation of alignment that causes the wire 20 and the first contact 5 to partly overlap each other when the same manufacturing steps as shown in FIGS. 9A to 9C are performed, there arise level differences on the surfaces of the wire 20 and the insulating film 21 as shown in FIG. 10B in the manufacturing step corresponding to that of FIG. 9C.

Figure 10C:
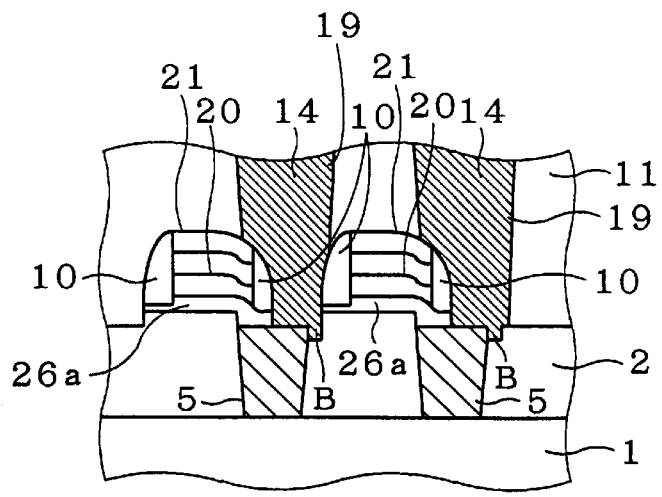

After forming the second insulating film 11 as shown in FIG. 10C, the via hole 19 that exposes the upper surface of the first contact 5 is provided. If the first insulating film 2 exists on the bottom surface of the via hole 19 when the via hole 19 is provided, that portion is overetched (the overetched portion is indicated by the reference sign B). Subsequently, the via hole 19 is filled with a conductive substance to serve as the second contact 14.

The semiconductor device obtained as above, like that of FIG. 8, allows an electrical insulation between the wire 20 and the stacked via, and this structure can be effectively applied to a highly-integrated semiconductor device that can not ensure a sufficient margin of alignment.

In the semiconductor device as discussed with reference to FIGS. 8 to 10C, the insulating film 26a made of the TEOS below the wire 20 is patterned at the same time when the insulating film 10a is etched back to form the side wall 10 on the side surface of the wire 20.

Figure 11:
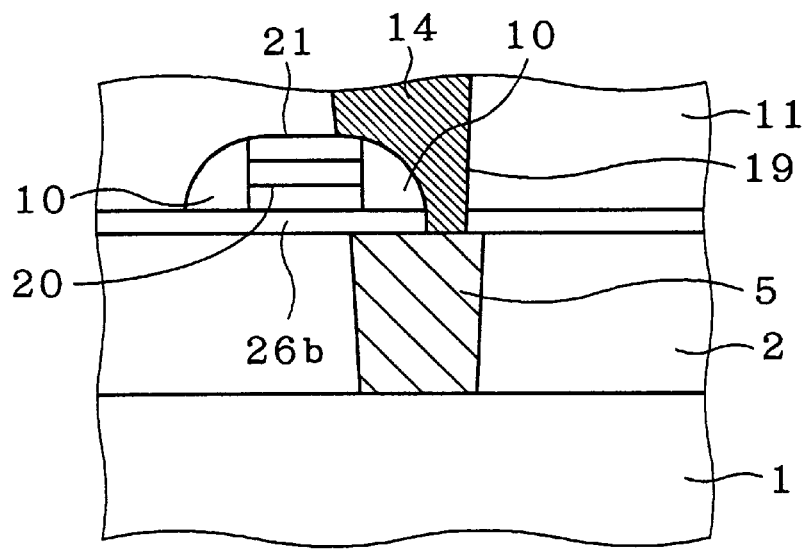
FIG. 11 shows the semiconductor device in accordance with the fifth preferred embodiment of the present invention.
Figure 12:
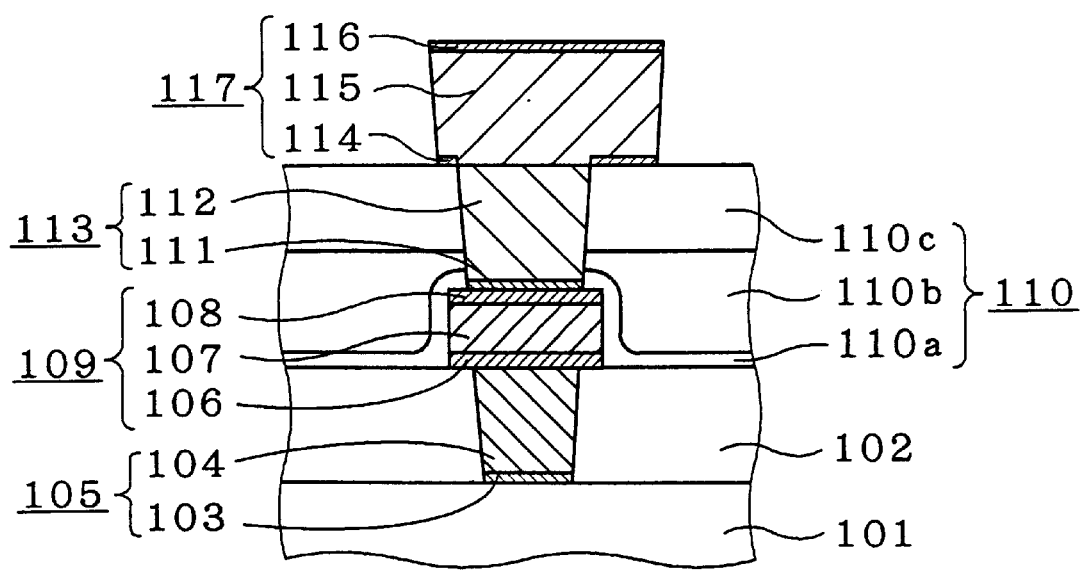
FIGS. 12 to 14 show background arts.
Figure 13:
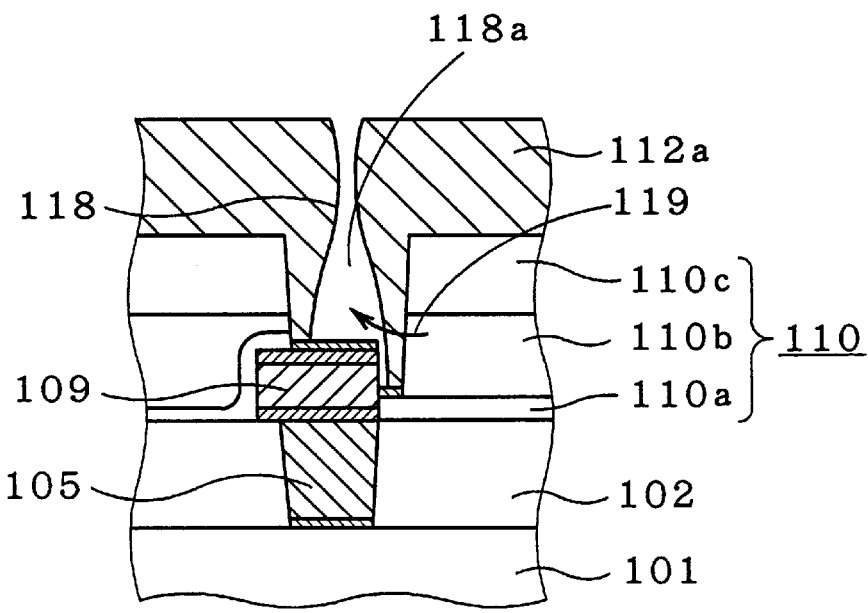
Figure 14:
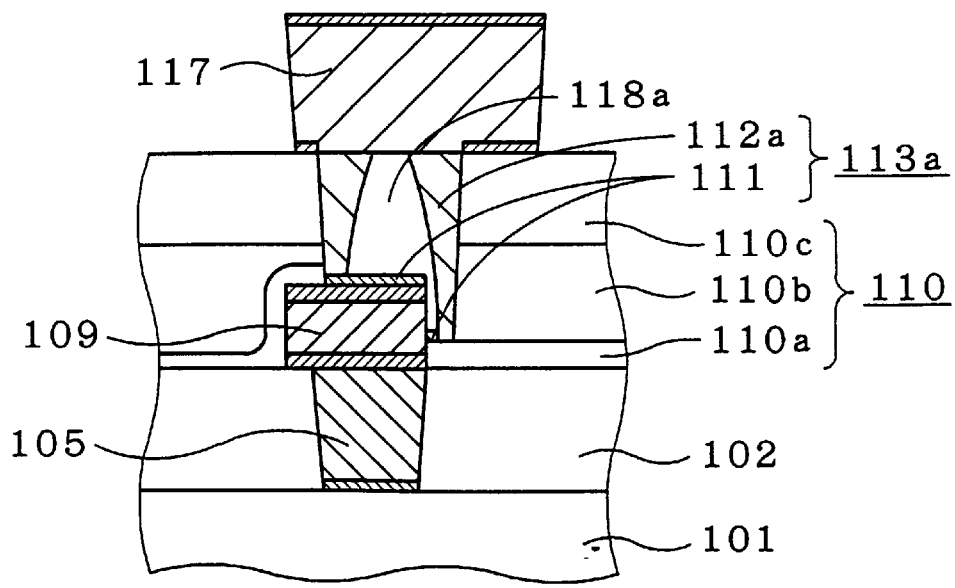
Figure 15:
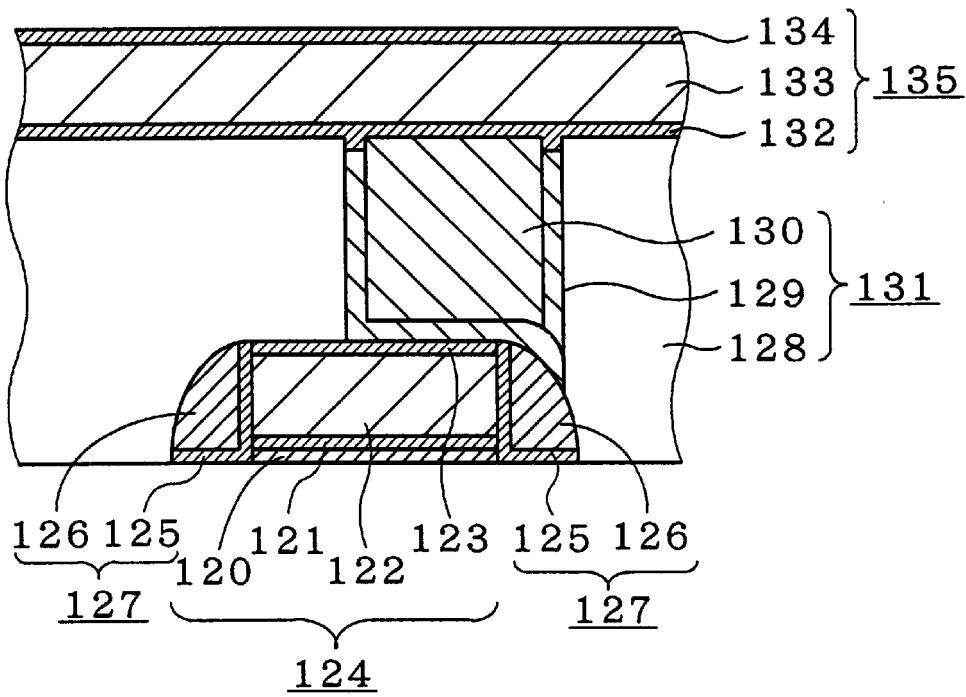
FIG. 15 shows a prior art.
Figure 16:
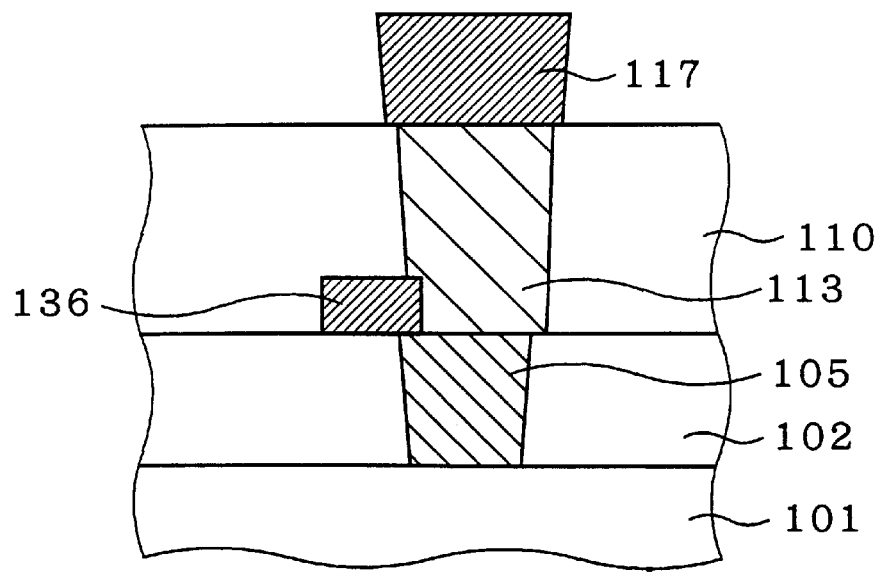
FIG. 16 shows a background art.

As shown in FIG. 11, however, the insulating film 26a may not be etched when the etchback is performed to form the side wall 10 and an insulating film 26b may be formed by selectively removing the insulating film 26a existing on the bottom surface of the via hole 19 when the via hole 19 is provided, to produce the same effect as the semiconductor device of FIG. 8 or 10A to 10C.

In the first to fifth preferred embodiments, the side wall 10 of insulative substance, which is formed on the side surface of the wire connected to or disposed in the vicinity of the stacked via which is the common structure to all the preferred embodiments, is not limited to a single-layered insulating film but may be a multi-layered insulating film.

While the invention has been shown and described in detail, the foregoing description is in all aspects illustrative and not restrictive. It is therefore understood that numerous modifications and variations can be devised without departing from the scope of the invention.

I claim:

1. A semiconductor device, comprising:

a semiconductor substrate;

a first insulating film layered on said semiconductor substrate;

a second insulating film layered on a surface of said first insulating film;

a first contact so formed on an active region in a surface region of said semiconductor substrate as to penetrate said first insulating film;

a wire formed on said surface of said first insulating film, being in contact with said first contact;

a side wall formed on a side surface of said wire, being made of an insulative substance different from a substance of said second insulating film; and a second contact embedded in said second insulating film.

2. The semiconductor device of claim 1, wherein said side wall is harder to etch than said second insulating film.

3. The semiconductor device of claim 1, wherein said insulative substance of which said side wall is made is layered also on a region in said surface of said wire other than a contact face on which said wire comes into contact with said second contact and said surface of said first insulating film.

4. The semiconductor device of claim 1, wherein said second insulating film consists of a plurality of insulating layers including a flow layer provided from a bottom surface of said second insulating film to a level which corresponds to an upper surface of said wire.

5. The semiconductor device of claim 1, wherein an upper-layer wire or a capacitor is so formed on said second insulating film as to be in contact with said second contact.

6. The semiconductor device of claim 2, wherein said wire includes a barrier metal layer in its upper surface or in its upper and bottom surfaces.

7. The semiconductor device of claim 3, wherein said wire includes a barrier metal layer in its upper surface or in its upper and bottom surfaces.

8. A semiconductor device, comprising:

a semiconductor substrate;

a first insulating film layered on said semiconductor substrate;

a second insulating film formed on a surface of said first insulating film;

a first contact so formed on an active region in a surface region of said semiconductor substrate as to penetrate said first insulating film;

a second contact so formed as to penetrate said second insulating film, being in contact with said first contact;

a wire formed on said first insulating film;

an insulating film layered on said wire, being made of an insulative substance different from a substance of said second insulating film; and a side wall formed on side surfaces of said wire and said insulating film, being made of an insulative substance different from said substance of said second insulating film.

9. The semiconductor device of claim 8, wherein said side wall and said insulating film are harder to etch than said second insulating film.

10. The semiconductor device of claim 8, wherein said wire is disposed on said first insulating film with another insulating film interposed therebetween.

11. The semiconductor device of claim 8, wherein said second contact or both said first and second contacts overlap at least part of said wire.

12. The semiconductor device of claim 8, wherein an upper-layer wire or a capacitor is so formed on said second insulating film as to be in contact with said second contact.

* * * * *